United States Patent
Masunaga et al.

(10) Patent No.: US 8,749,113 B2
(45) Date of Patent: Jun. 10, 2014

(54) ELECTROSTATIC ACTUATOR INCLUDING A PLURALITY OF URGING UNITS WITH VARYING RIGITIES

(75) Inventors: Takayuki Masunaga, Kanagawa-ken (JP); Hiroaki Yamazaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 605 days.

(21) Appl. No.: 12/954,806

(22) Filed: Nov. 26, 2010

(65) Prior Publication Data

US 2011/0140570 A1    Jun. 16, 2011

(30) Foreign Application Priority Data

Nov. 27, 2009    (JP) .................... 2009-270772

(51) Int. Cl.
*H02N 1/00*    (2006.01)
*H02K 5/00*    (2006.01)
(52) U.S. Cl.
USPC ..................... 310/309; 310/40 MM
(58) Field of Classification Search
CPC ....... H02N 1/008; H02N 1/006; H02K 57/00; H02K 5/225
USPC ......................... 310/309, 400 MM
IPC ..................... H02K 5/00; H01N 1/00
See application file for complete search history.

(56) References Cited

U.S. PATENT DOCUMENTS

| | | | | |
|---|---|---|---|---|
| 6,489,864 B2* | 12/2002 | Frey et al. | ..................... | 333/197 |
| 7,498,715 B2* | 3/2009 | Yang | ............... | 310/309 |
| 7,629,725 B1 | 12/2009 | Knollenberg et al. | | |
| 7,699,296 B1 | 4/2010 | Knollenberg et al. | | |
| 7,741,685 B1 | 6/2010 | Knollenberg et al. | | |
| 2003/0178912 A1* | 9/2003 | Norimatsu | ..................... | 310/309 |
| 2003/0178913 A1* | 9/2003 | Norimatsu | ..................... | 310/309 |

(Continued)

FOREIGN PATENT DOCUMENTS

| | | |
|---|---|---|
| CN | 1661902 A | 8/2005 |
| JP | 2007-35641 | 2/2007 |

(Continued)

OTHER PUBLICATIONS

Search Report issued Apr. 21, 2011 in Netherlands Application No. 1038406.

(Continued)

*Primary Examiner* — Terrance Kenerly
(74) *Attorney, Agent, or Firm* — Oblon, Spivak, McClelland, Maier & Neustadt, L.L.P.

(57) ABSTRACT

According to one embodiment, an electrostatic actuator includes an electrode unit, a conductive film body unit, a plurality of first urging units, and a plurality of second urging units. The electrode unit is provided on a substrate. The conductive film body unit is provided opposing the electrode unit. The plurality of first urging units are provided at a first circumferential edge portion of the conductive film body unit to support the film body unit. The plurality of second urging units are provided at a second circumferential edge portion opposing the first circumferential edge portion to support the film body unit. The electrode unit and the conductive film body unit contact or separate by the electrode unit being set to a voltage having a prescribed value. The plurality of first urging units have mutually different rigidities, and the plurality of second urging units have mutually different rigidities.

23 Claims, 11 Drawing Sheets

(56) References Cited

U.S. PATENT DOCUMENTS

| | | | |
|---|---|---|---|
| 2004/0160118 | A1 | 8/2004 | Knollenberg et al. |
| 2004/0233505 | A1 | 11/2004 | Huibers et al. |
| 2005/0189845 | A1 | 9/2005 | Kihara |
| 2007/0017994 | A1* | 1/2007 | Wolter et al. ............ 235/462.37 |
| 2007/0024401 | A1* | 2/2007 | Kim et al. .................... 333/262 |
| 2007/0241680 | A1* | 10/2007 | Ohmura et al. ............... 313/533 |
| 2010/0163376 | A1 | 7/2010 | Yoon et al. |

FOREIGN PATENT DOCUMENTS

| | | |
|---|---|---|
| JP | 2008-278634 | 11/2008 |
| JP | 2009-081963 A | 4/2009 |
| JP | 2009-105031 A | 5/2009 |
| JP | 2009-536015 A | 10/2009 |

OTHER PUBLICATIONS

U.S. Appl. No. 13/421,142, filed Mar. 15, 2012, Masunaga, et al.

Combined Office Action and Search Report issued May 13, 2013 in Chinese Patent Application No. 201010573402.2 (with partial English language translation).

\* cited by examiner

ELECTROSTATIC ACTUATOR INCLUDING A PLURALITY OF URGING UNITS WITH VARYING RIGITIES

CROSS-REFERENCE TO RELATED APPLICATIONS

This application is based upon and claims the benefit of priority from the prior Japanese Patent Application No. 2009-270772, filed on Nov. 27, 2009; the entire contents of which are incorporated herein by reference.

FIELD

Embodiments described herein relate generally to an electrostatic actuator.

BACKGROUND

Electrostatic actuators are known in which an electrostatic force acts between a stator and a mover included in an actuator, and the attraction force thereof is used to drive the mover. Further, so-called semiconductor processes (the manufacturing technology of semiconductor devices) have been used to develop extremely small electrostatic actuators in MEMS (Micro Electro Mechanical Systems) and the like.

Also in MEMS and the like, so-called MEMS switches that utilize electrostatic actuators are known. There are such known MEMS switches in which a film body unit is suspended by multiple spring components; when the switch is ON, a pull-in voltage is provided and the film body unit is electrostatically attracted to the electrode unit against a spring force of the spring components; and when the switch is OFF, a pull-out voltage is provided and the film body unit is caused to separate from the electrode unit by the spring force of the spring components.

Electrostatically-driven MEMS switches generally have a high pull-in voltage of, for example, not less than 20 V (volts). Therefore, in the case where a MEMS switch is used in a mobile system such as a mobile telephone, a voltage step-up circuit is necessary. In such a case, it is disadvantageous for the mobile system because the voltage step-up circuit not only has a large chip surface area but also uses a large current. Moreover, noise occurring in the voltage step-up circuit may cause misoperations of the wireless circuit.

In such a case, reducing the rigidities of the spring components can reduce the pull-in voltage. However, in the case where the rigidities of the spring components are simply reduced, a discrepancy in which the film body unit and the electrode unit remain in contact and do not separate, i.e., a so-called stiction defect, occurs easily. Further, reducing the pull-in voltage weakens the force with which the film body unit and the electrode unit contact each other, i.e., the contact force. As a result, there is a risk that the contact resistance of the switch may undesirably increase.

Such problems exist not only in contact-type MEMS switches but also similarly in variable capacitors and the like used in high frequency circuits. In other words, simply reducing the rigidities of the spring components to reduce the pull-in voltage causes stiction defects to occur easily. Also, there is a risk that a large capacitance ratio cannot be obtained because the contact force is weakened.

Therefore, technology has been proposed to suspend the film body unit using multiple spring components having different rigidities, electrostatically attract the portion of the film body unit from the side where the spring components having low rigidities are provided in the ON state, and separate from the portion of the film body unit on the side where the spring components having high rigidities are provided in the OFF state (refer to JP-A 2007-35641 (Kokai)).

However, in the technology discussed in JP-A 2007-35641 (Kokai), there is no consideration for attracting the film body unit to the electrode unit by a small force when starting the attraction; and there is a risk of unstable operations when starting the attraction.

Further, because the spring components are provided on the short sides of a film body unit having a rectangular shape, the film body unit flexes easily between the opposing spring components. Therefore, there is a risk of unstable operations during separation when the switch is OFF such as the film body unit flexing and a portion of the film body unit not separating from the electrode unit, etc.

BRIEF DESCRIPTION OF THE DRAWINGS

FIG. 1A is a schematic plan view and FIG. 1B is a cross-sectional view along A-A of FIG. 1A;

FIG. 2A is a schematic perspective view illustrating a film body unit and urging units and FIG. 2B is an enlarged schematic view of portion B of FIG. 2A;

DETAILED DESCRIPTION

Figure 1A:
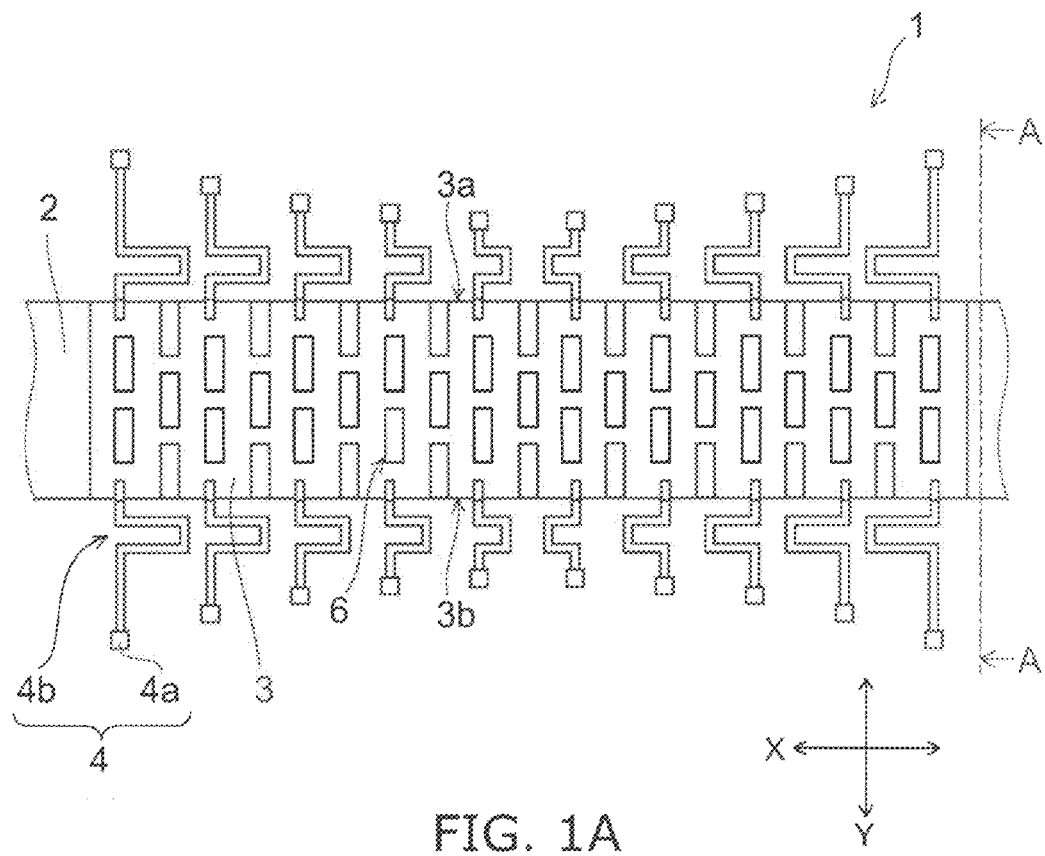
FIGS. 1A and 1B are schematic views illustrating an electrostatic actuator according to an embodiment, where

In general, according to one embodiment, an electrostatic actuator includes an electrode unit, a conductive film body unit, a plurality of first urging units, and a plurality of second urging units. The electrode unit is provided on a substrate. The conductive film body unit is provided opposing the electrode unit. The plurality of first urging units are provided at a first circumferential edge portion of the conductive film body unit to support the film body unit. The plurality of second urging units are provided at a second circumferential edge portion opposing the first circumferential edge portion to support the film body unit. The electrode unit and the conductive film body unit contact or separate by the electrode unit being set to a voltage having a prescribed value. The plurality of first urging units have mutually different rigidities, and the plurality of second urging units have mutually different rigidities.

Embodiments of the invention will now be illustrated with reference to the drawings. Similar components in the drawings are marked with like reference numerals, and a detailed description is omitted as appropriate. Arrows X, Y, and Z in the drawings illustrate mutually orthogonal directions.

Figure 1B:
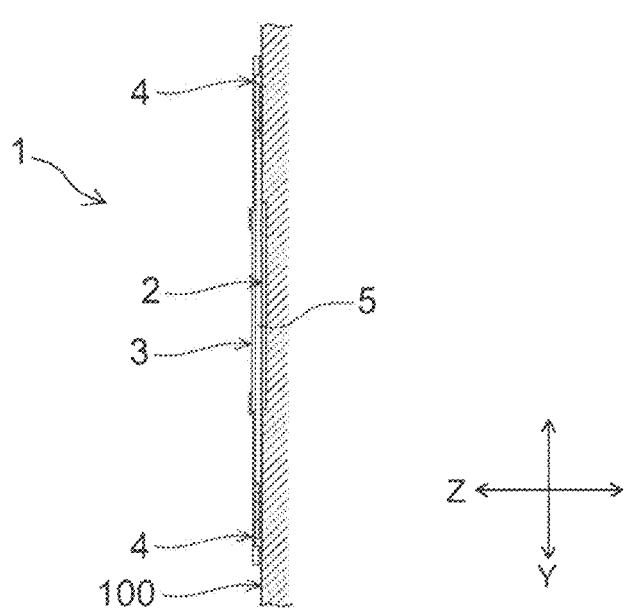

FIGS. 1A and 1B are schematic views illustrating the electrostatic actuator according to this embodiment.

FIG. 1A is a schematic plan view; and FIG. 1B is a cross-sectional view along A-A of FIG. 1A.

Figure 2A:
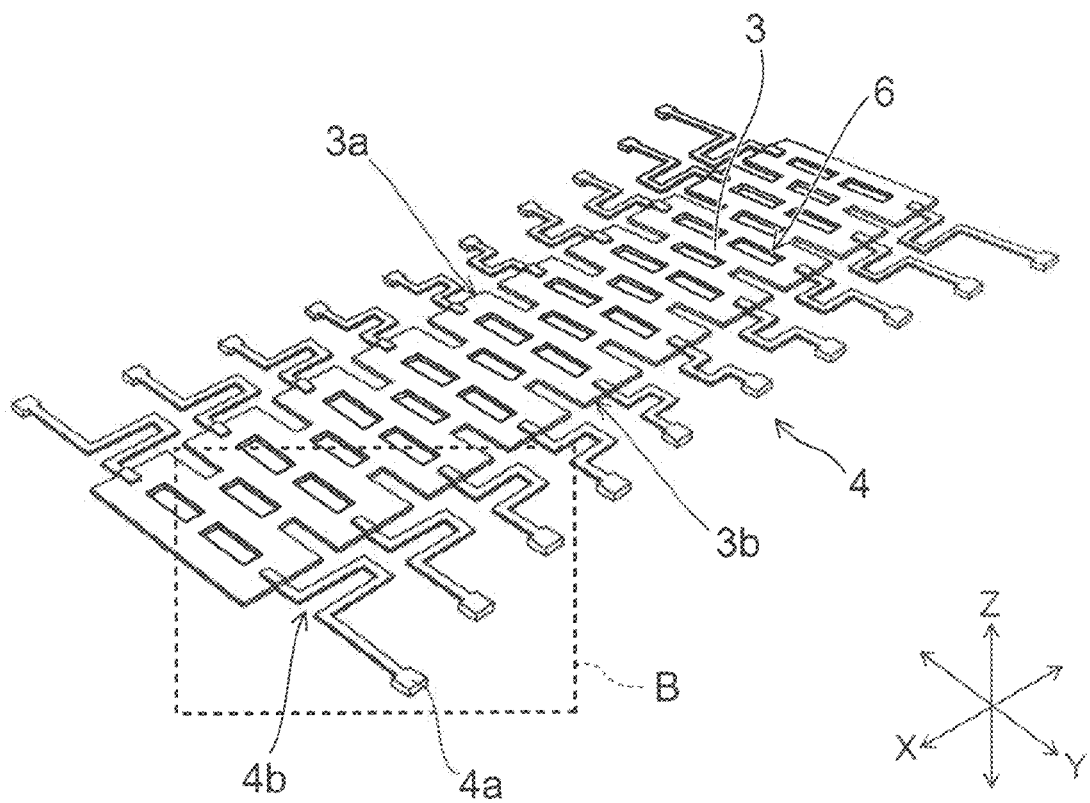
FIGS. 2A and 2B are schematic perspective views illustrating the electrostatic actuator according to the embodiment, where
Figure 2B:
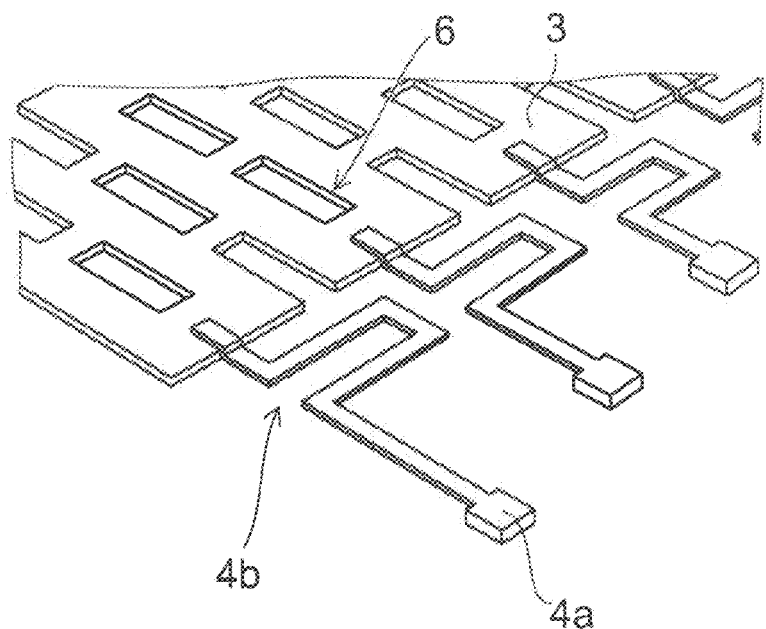

FIGS. 2A and 2B are schematic perspective views illustrating the electrostatic actuator according to this embodiment. FIG. 2A is a schematic perspective view illustrating a film body unit and urging units; and FIG. 2B is an enlarged schematic view of portion B of FIG. 2A.

As illustrated in FIGS. 1A and 1B and FIGS. 2A and 2B, an electrode unit 2, a film body unit 3, and urging units 4 are provided in the electrostatic actuator 1.

As illustrated in FIG. 1B, the electrode unit 2 is provided on a substrate 100.

The electrode unit 2 may be formed of a conductive material such as, for example, a metal. In such a case, it is favorable for the conductive material to have a low resistance value. It is favorable also to use a material usable in the film formation, etching, etc., of so-called semiconductor processes (the manufacturing technology of semiconductor devices). This may include, for example, aluminum (Al), gold (Au), silver (Ag), copper (Cu), platinum (Pt), or alloys including the same, etc.

The major surface of the electrode unit 2 is covered with an insulating material. In such a case, it is favorable for the insulating material to be a material usable in the film formation, etching, etc., of so-called semiconductor processes (the manufacturing technology of semiconductor devices). This may include, for example, silicon oxide (SiO, $SiO_2$, etc.), silicon nitride (SiN), etc.

A not-illustrated direct-current power source is connected to the electrode unit 2; and positive charge or negative charge can be provided to the electrode unit 2. Therefore, the electrode unit 2 can electrostatically attract the film body unit 3.

A not-illustrated signal generation unit also is connected to the electrode unit 2; and a signal voltage can be applied to the electrode unit 2. In other words, a voltage which is the sum of the signal voltage and the drive voltage for electrostatically attracting the film body unit 3 is applied to the electrode unit 2. The substrate 100 on which the electrode unit 2 is provided may be formed of an insulating material such as, for example, glass. The substrate 100 also may be formed by covering the surface of a conductive material or a semiconductor material such as silicon (Si) and the like with an insulating material, etc.

The film body unit 3 is provided opposing the electrode unit 2.

The film body unit 3 is formed of a conductive material such as a metal. In such a case, it is favorable to use a material usable in the film formation, etching, etc., of so-called semiconductor processes (the manufacturing technology of semiconductor devices). This may include, for example, aluminum (Al), gold (Au), silver (Ag), copper (Cu), platinum (Pt), or alloys including the same, etc.

The film body unit 3 is supported by the urging units 4 such that a gap 5 of a prescribed dimension forms between the major surface of the film body unit 3 and the major surface of the electrode unit 2 in the state in which a voltage is not applied to the electrode unit 2.

A not-illustrated flexible grounding portion is connected to the film body unit 3 such that the film body unit 3 has the ground potential. Therefore, the electrical capacitance between the film body unit 3 and the electrode unit 2 can be changed by changing the dimension of the gap 5 that forms between the major surface of the film body unit 3 and the major surface of the electrode unit 2. Then, the change of the electrical capacitance can be utilized in switching and the like.

The urging units 4 are provided at a first circumferential edge portion 3a and a second circumferential edge portion 3b of the film body unit 3 which has a rectangular shape. Therefore, the film body unit 3 flexes easily in the X direction (the long-axis direction) of the drawings and does not flex easily in the Y direction (the direction substantially orthogonal to the long-axis direction).

Holes 6 are provided in the film body unit 3. The holes 6 have rectangular shapes and are provided such that the long-axis directions of the holes 6 and the long-axis direction of the film body unit 3 are substantially orthogonal. One end of the hole 6 provided proximally to the first circumferential edge portion 3a and the second circumferential edge portion 3b of the film body unit 3 is open at the first circumferential edge portion 3a and the second circumferential edge portion 3b of the film body unit 3. Therefore, because the holes 6 are provided, the film body unit 3 flexes even more easily in the X direction (the long-axis direction) of the drawings.

Figure 3A:
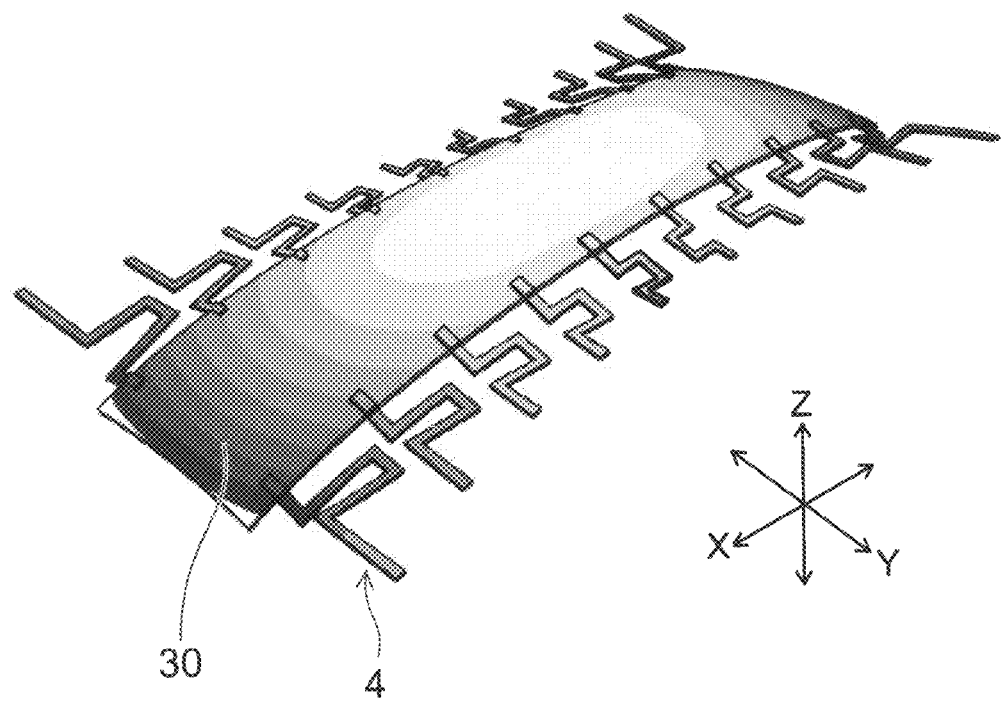
FIGS. 3A and 3B are schematic views illustrating effects in the case where holes are provided.
Figure 3B:
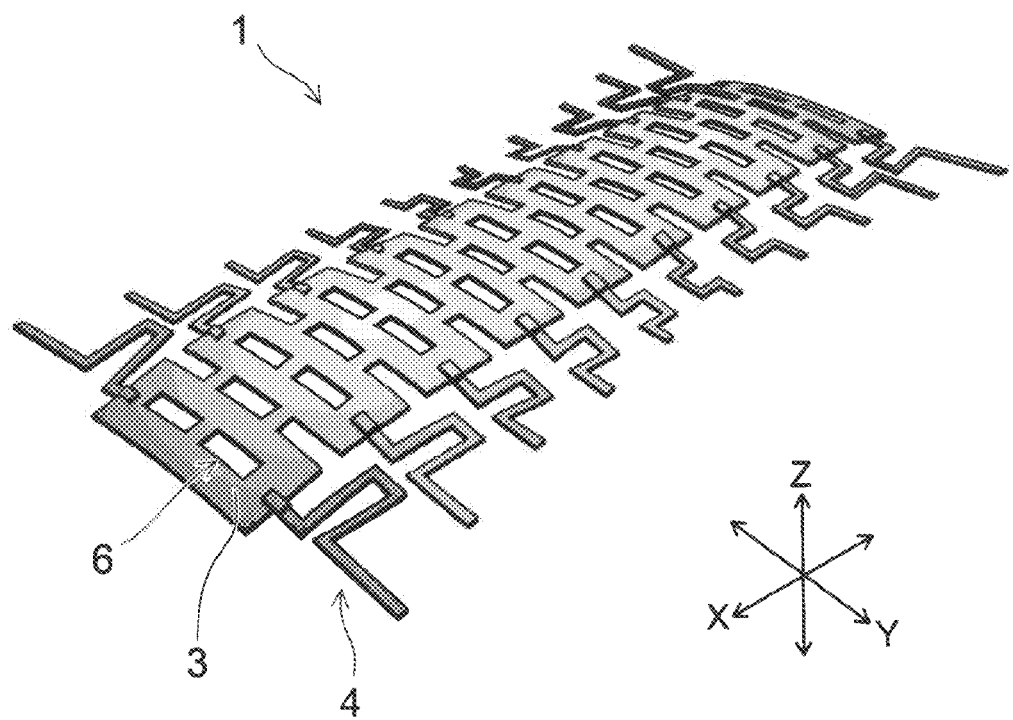

FIGS. 3A and 3B are schematic views illustrating the effects in the case where the holes 6 are provided.

FIGS. 3A and 3B are the results of a FEM (Finite Element Method) simulation of the displacement amount (the warp amount) in the Z direction when a simulated nonuniform stress distribution is applied to the film body unit 3. The Z-direction displacement amount is illustrated by monotone shading in which larger Z-direction displacement amounts are lighter and smaller Z-direction displacement amounts are darker.

Here, the electrostatic actuator 1 can be manufactured using, for example, semiconductor processes (the manufacturing technology of semiconductor devices). In such a case, there is a risk that residual stress may occur in the film formation in the case where sputtering, vapor deposition, etc., are used. Moreover, there is a risk of the crystal characteristics of thin films (the film body unit 3) changing and warp occurring also in heat treatment processes after the film formation.

In the case where the holes 6 are not provided in a film body unit 30 as illustrated in FIG. 3A, the displacement amount (the warp amount) of the film body unit 30 in the Z direction due to the residual stress is large.

On the other hand, in the case where the holes 6 are provided in the film body unit 3 as illustrated in FIG. 3B, the displacement amount (the warp amount) of the film body unit 3 in the Z direction due to the residual stress can be reduced.

By providing the holes 6 in the film body unit 3, the film body unit 3 flexes more easily in the X direction (the long-axis direction) of the drawings. Therefore, the displacement amount (the warp amount) of the film body unit 3 in the Z direction can be reduced because it is easier for the urging units 4 to correct the deformation of the film body unit 3 due to the residual stress.

As illustrated in FIGS. 1A and 1B, FIGS. 2A and 2B, etc., the film body unit 3 flexes more easily in the X direction (the long-axis direction of the film body unit 3) of the drawings in the case where the holes 6 are provided such that the long-axis directions of the holes 6 and the long-axis direction of the film body unit 3 are substantially orthogonal. Moreover, in the case where the one end of the holes 6 provided proximally to the first circumferential edge portion 3a and the second circumferential edge portion 3b of the film body unit 3 is open at the first circumferential edge portion 3a and the second circumferential edge portion 3b of the film body unit 3, the film body unit 3 flexes even more easily in the X direction (the long-axis direction of the film body unit 3) of the drawings.

Therefore, by providing such holes 6, the displacement amount (the warp amount) of the film body unit 3 in the Z direction due to the residual stress can be reduced further.

A connection unit 4a is provided at one end of the urging unit 4; and the connection unit 4a is connected to the substrate 100. One other end of the urging unit 4 is connected to the first circumferential edge portion 3a or the second circumferential edge portion 3b of the film body unit 3. The urging unit 4 is formed of an elastic material. Therefore, the urging unit 4 forms a so-called elastic beam.

A buffer unit 4b is provided in the urging unit 4. The buffer unit 4b is provided to reduce the thermal stress occurring due to thermal expansion and the like. For example, the buffer unit 4b provided in the urging unit 4 illustrated in FIGS. 1A and 1B and FIGS. 2A and 2B is formed to protrude in a direction orthogonal to the long-axis direction of the urging unit 4 (corresponding to the longitudinal direction). Then, in the case where thermal expansion occurs in the X direction and the Y direction, the thermal stress can be reduced by deformation of the buffer unit 4b.

It is favorable for the material of the urging unit 4 to be usable in the film formation, etching, etc., of so-called semiconductor processes (the manufacturing technology of semiconductor devices). This may include, for example, silicon nitride (SiN), silicon oxide (SiO, $SiO_2$, etc.), titanium aluminide (TiAl, $Ti_3Al$, $Al_3Ti$, etc.), metals such as aluminum (Al), etc. In such a case, considering the life of the urging unit 4 (the number of bends to fracture, etc.), it is favorable to be formed of a material having a high resistance to creep deformation. According to knowledge obtained by the inventors, it is favorable to be formed of a material having a resistance to creep deformation higher than that of aluminum (Al). For example, of those described above, it is favorable to use silicon nitride (SiN), silicon oxide (SiO, $SiO_2$, etc.), and titanium aluminide (TiAl, $Ti_3Al$, $Al_3Ti$, etc.).

Multiple first urging units (e.g., the urging units 4 provided at the Y-direction upper side in FIGS. 1A and 1B) are provided at the first circumferential edge portion 3a of the film body unit 3 to support the film body unit 3; and multiple second urging units (e.g., the urging units 4 provided at the Y-direction lower side in FIGS. 1A and 1B) are provided at the second circumferential edge portion 3b opposing the first circumferential edge portion 3a to support the film body unit 3. The rigidities of the first urging units are different from each other; and the rigidities of the second urging units are different from each other. In other words, the multiple urging units 4 having different rigidities are provided at the opposing first circumferential edge portion 3a and the second circumferential edge portion 3b of the film body unit 3.

The rigidities of the urging units 4 change in stages or gradually along the first circumferential edge portion 3a and the second circumferential edge portion 3b of the film body unit 3. The rigidities of the first urging units are higher at the central portion side of the first circumferential edge portion 3a than at the end portion side of the first circumferential edge portion 3a. The rigidities of the second urging units are higher at the central portion side of the second circumferential edge portion 3b than at the end portion side of the second circumferential edge portion 3b.

The first urging units and the second urging units are provided at mutually opposing positions. The rigidity of the first urging unit and the rigidity of the second urging unit at mutually opposing positions are substantially the same. In other words, the urging units 4 are provided at mutually opposing positions of the opposing first circumferential edge portion 3a and the second circumferential edge portion 3b of the film body unit 3. The rigidities of the urging units 4 at mutually opposing positions are substantially the same.

The rigidity of the urging unit 4 can be changed by changing the dimensions of the urging unit 4. For example, the rigidity is inversely proportional to the cube of the length dimension (the Y-direction dimension) of the urging unit 4 and is proportional to the width dimension (the X-direction dimension) of the urging unit 4. The rigidity is proportional to the cube of the thickness dimension (the Z-direction dimension) of the urging unit 4. Therefore, the rigidity of the urging unit 4 increases as the length dimension of the urging unit 4 decreases and as the width dimension increases. Also, the rigidity of the urging unit 4 increases as the thickness dimension of the urging unit 4 increases.

In the case illustrated in FIGS. 1A and 1B and FIGS. 2A and 2B, the width dimension (the X-direction dimension) and the thickness dimension (the Z-direction dimension) are substantially equal; and the rigidity is changed by changing the length dimension of the urging unit 4. In the X direction, the rigidities of the urging units 4 decrease in stages or gradually by the urging units 4 having the shortest length dimension being provided at the central portion of the film body unit 3 and by the length dimensions of the urging units 4 being longer toward the end portions of the film body unit 3. In other words, the rigidities of the urging units 4 provided proximally to the two end portions of the film body unit 3 are the lowest; and the rigidities of the urging units 4 provided proximally to the central portion of the film body unit 3 are the highest. In the Y direction, the rigidities of mutually opposing urging units 4 are substantially the same.

Operations of the electrostatic actuator 1 according to this embodiment will now be illustrated.

Figure 4:
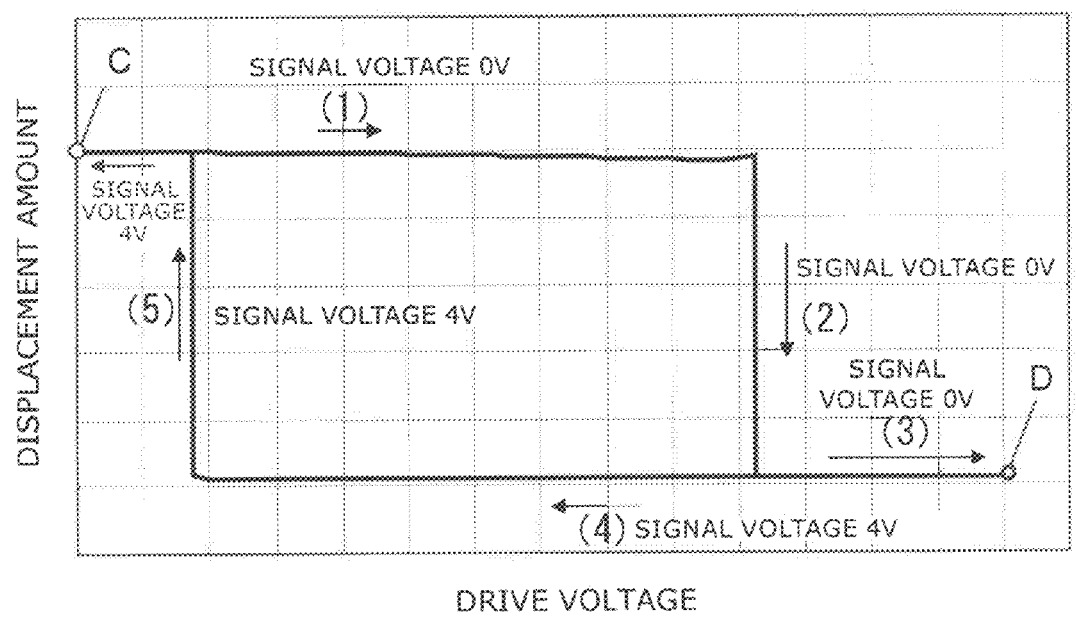
FIG. 4 is a schematic graph illustrating operations of the electrostatic actuator according to the embodiment.

FIG. 4 is a schematic graph illustrating the operations of the electrostatic actuator according to this embodiment.

FIG. 4 is the result of a FEM (the Finite Element Method) simulation of the drive characteristic of the electrostatic actuator. The vertical axis corresponds to the Z-direction displacement amount of the film body unit center; and the horizontal axis corresponds to the drive voltage. In such a case, while electrostatic attraction occurs due to the signal voltage in addition to the drive voltage, the conditions most severe for the drive characteristic were used in this simulation. In other words, the calculations were performed with a signal voltage of 0 V (volts) applied during the pull in (during the attraction) and a signal voltage of 4 V (volts) applied during the pull out (during the separation). In the drawing, point C is the attraction start position and point D is the attraction stop position.

As illustrated in FIG. 4, in the case where the film body unit 3 is electrostatically attracted to the electrode unit 2, a drive voltage is applied to the electrode unit 2 by a not-illustrated direct-current power source. When the drive voltage is applied to the electrode unit 2, the film body unit 3 is electrostatically attracted to the electrode unit 2 because positive charge or negative charge is provided to the electrode unit 2. Then, because the electrostatic attraction force increases as the drive voltage increases from point C along arrow (1), the electrode unit 2 electrostatically holds the film body unit 3 at the pull-in voltage of the portion of arrow (2). The drive voltage increases along arrow (3) until reaching point D.

When the film body unit 3 is electrostatically attracted to the electrode unit 2, first, the urging units 4 having low rigidities provided at the two X-direction end portions of the film body unit 3 flex; and the dimension of the gap 5 at this portion decreases. Here, the electrostatic attraction force is inversely proportional to the square of the dimension of the gap 5 that forms between the major surface of the film body unit 3 and the major surface of the electrode unit 2. Therefore, the film body unit 3 is easily attracted because a large attraction force occurs when the dimension of the gap 5 decreases. Then, the film body unit 3 flexes in a curve by being pulled by this portion; and the portions where the dimension of the gap 5 is small, that is, the portions where a large attraction force occurs, expand gradually in the X direction. Therefore, the film body unit 3 can be attracted easily even in the case where the rigidities of the urging units 4 increase toward the central portion of the film body unit 3. Further, the pull-in voltage (the voltage of the portion of arrow (2) of FIG. 4) necessary to electrostatically hold the film body unit 3 to the electrode unit 2 can be reduced.

The film body unit 3 has a rectangular configuration. Therefore, the film body unit 3 flexes easily in the X direction (the long-axis direction) of the drawings. Also, the holes 6 are provided such that the film body unit 3 flexes easily in the X direction (the long-axis direction) of the drawings.

Therefore, the pull-in voltage (the voltage of the portion of arrow (2) of FIG. 4) necessary to electrostatically hold the film body unit 3 to the electrode unit 2 can be reduced further.

Moreover, the film body unit 3 does not flex easily in the Y direction (the direction substantially orthogonal to the long-axis direction) of the drawings. Therefore, the operations can be stabilized because unnecessary deformation can be suppressed.

Here, a not-illustrated flexible grounding portion is connected to the film body unit 3; and the film body unit 3 has the ground potential. Therefore, the electrical capacitance between the film body unit 3 and the electrode unit 2 changes due to the change of the dimension of the gap 5 that forms between the major surface of the film body unit 3 and the major surface of the electrode unit 2. Then, the change of the electrical capacitance can be utilized in switching, etc.

At point D, a signal voltage of 4 V (volts) is applied to the electrode unit 2 by a not-illustrated signal generation unit. Thus, the electrostatic attraction is performed by a voltage which is the sum of the drive voltage and the signal voltage in the case where the signal voltage is applied to the electrode unit 2.

In the case where the film body unit 3 is separated from the electrode unit 2, the application of the drive voltage to the electrode unit 2 by the not-illustrated direct-current power source is stopped. When the application of the drive voltage to the electrode unit 2 is stopped, the electrostatic attraction is released because the supply of the positive charge or the negative charge to the electrode unit 2 is stopped. Then, as the drive voltage drops from point D along arrow (4), the film body unit 3 separates from the electrode unit 2 at the pull-out voltage of the portion of arrow (5) because the electrostatic attraction decreases.

When the electrostatic attraction is released, first, the central portion of the film body unit 3 separates from the electrode unit 2 due to the elastic force of the urging units 4 having high rigidities provided at the X-direction central portion of the film body unit 3. At the portion where the film body unit separates from the electrode unit 2, the electrostatic attraction force decreases and the film body unit 3 can separate easily because the dimension of the gap 5 increases. Then, the film body unit 3 flexes in a curve by being pulled by this portion; and the portions where the dimension of the gap 5 is large, that is, the portions where the electrostatic attraction force decreases, expand gradually in the X direction. Therefore, the film body unit 3 can be separated easily even in the case where the rigidities of the urging units 4 decrease toward the two end portions of the film body unit 3.

Here, an electrostatic attraction force occurs due to the signal voltage because the signal voltage is applied to the electrode unit 2. Moreover, residual charge may remain even in the case where the application of the drive voltage is stopped.

In this embodiment, the urging units 4 having high rigidities are provided at the X-direction central portion of the film body unit 3; and the separation position can have a starting point of the separation due to the urging units 4 provided at the central portion and can gradually expand in the X direction. Therefore, the pull-out voltage (the voltage of the portion of arrow (5) of FIG. 4) can be increased when the film body unit 3 is separated from the electrode unit 2.

The film body unit 3 has a rectangular configuration. Therefore, the film body unit 3 flexes easily in the X direction (the long-axis direction) of the drawings. Moreover, the holes 6 are provided such that the film body unit 3 flexes easily in the X direction (the long-axis direction) of the drawings.

Therefore, the pull-out voltage (the voltage of the portion of arrow (5) of FIG. 4) when the film body unit 3 is separated from the electrode unit 2 can be increased further.

The film body unit 3 does not flex easily in the Y direction (the direction substantially orthogonal to the long-axis direction) of the drawings. Therefore, the operations can be stabilized because unnecessary deformation can be suppressed.

FIGS. 5A to 5E are schematic views illustrating electrostatic actuators according to comparative examples.

Figure 6:
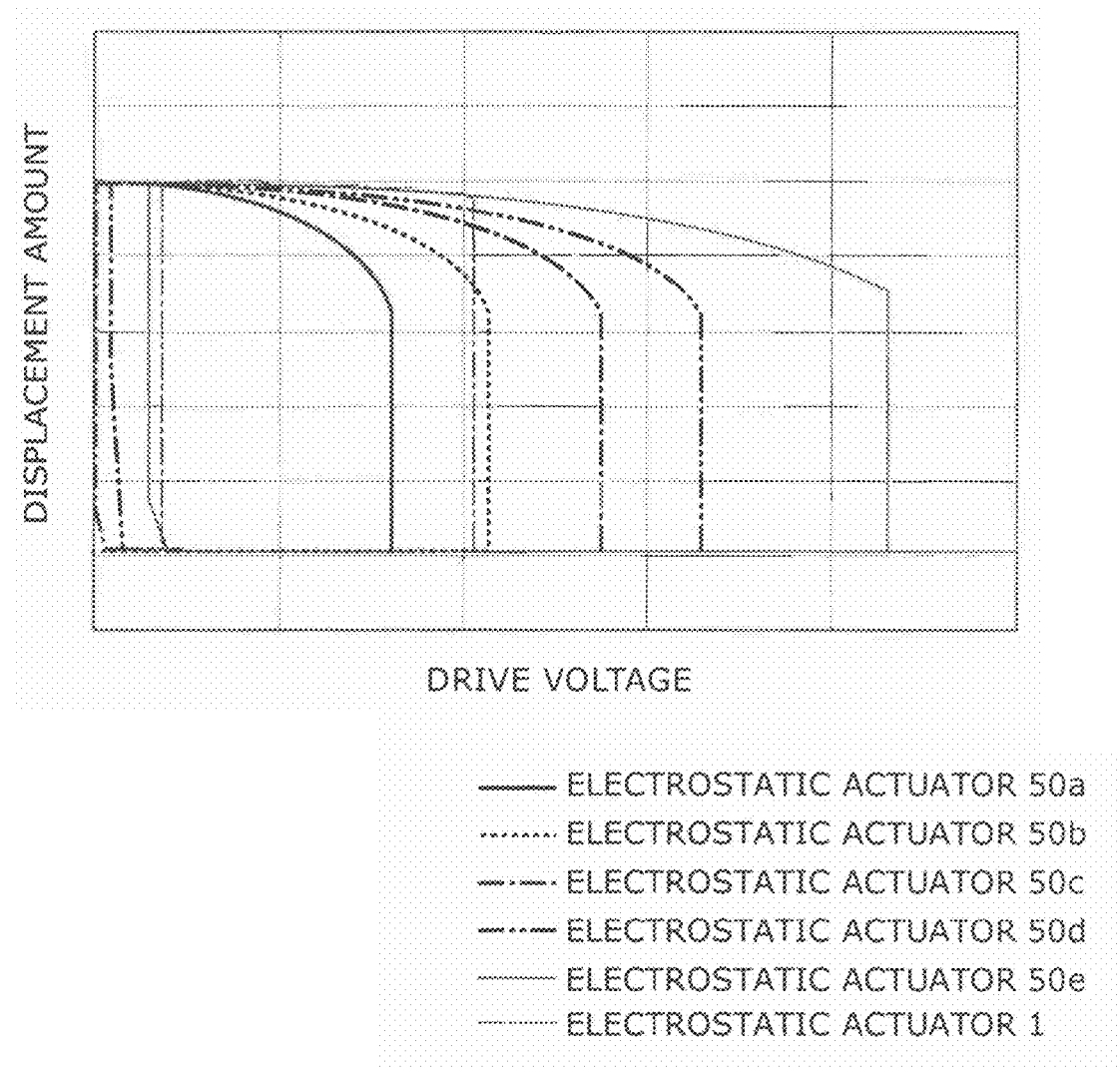
FIG. 6 is a schematic graph illustrating drive characteristics of the electrostatic actuators.

FIG. 6 is a schematic graph illustrating drive characteristics of the electrostatic actuators.

Figure 5A:
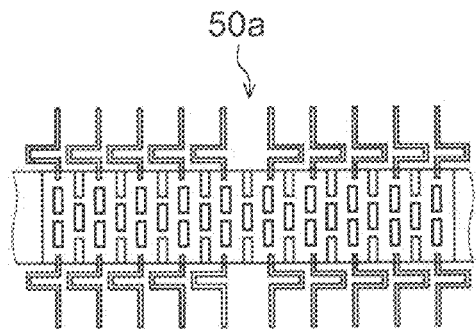
FIGS. 5A to 5E are schematic views illustrating electrostatic actuators according to comparative examples.
Figure 5B:
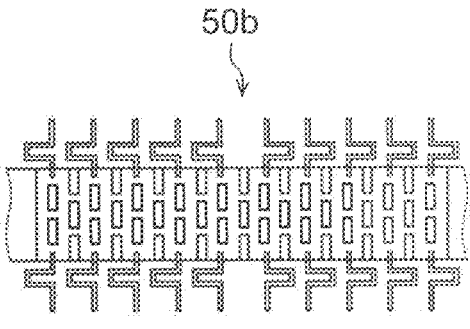
Figure 5C:
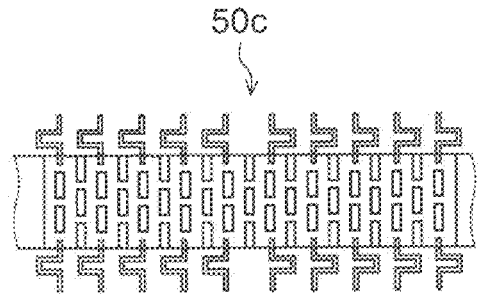
Figure 5D:
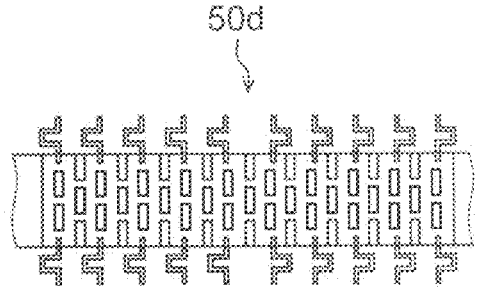
Figure 5E:
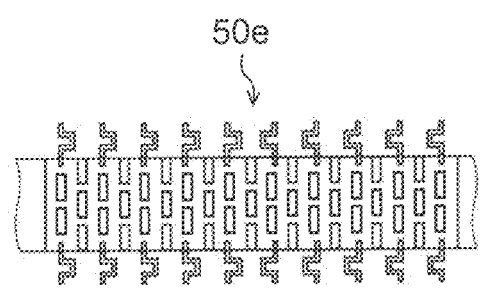

In the electrostatic actuators 50a to 50e illustrated in FIGS. 5A to 5E, the rigidities of the urging units of each of the electrostatic actuators are substantially the same. In such a case, the rigidities of the urging units provided in the electrostatic actuator 50a illustrated in FIG. 5A are the lowest; and the rigidities of the urging units increase in the order of the electrostatic actuator 50b illustrated in FIG. 5B, the electrostatic actuator 50c illustrated in FIG. 5C, the electrostatic actuator 50d illustrated in FIG. 5D, and the electrostatic actuator 50e illustrated in FIG. 5E.

FIG. 6 is the result of a FEM (the Finite Element Method) simulation of the drive characteristics of the electrostatic actuators. The vertical axis corresponds to the Z-direction displacement amount of the film body unit center; and the horizontal axis corresponds to the drive voltage. In such a case, while electrostatic attraction occurs due to the signal voltage in addition to the drive voltage, the conditions most severe for the drive characteristics were used in this simulation. In other words, the calculations were performed with a signal voltage of 0 V (volts) applied during the pull in (during the attraction) and a signal voltage of 4 V (volts) applied during the pull out (during the separation).

FIG. 6 shows that the pull-in voltage can be reduced by reducing the rigidities of the urging units as in the electrostatic actuator 50a. However, in the state in which a signal voltage of 4 V (volts) is applied, the film body unit 3 unfortunately cannot be separated from the electrode unit 2 in the case where the rigidities of the urging units is uniformly low as in the electrostatic actuators 50a, the 50b, and the 50c.

In such a case, by increasing the rigidities of the urging units as in the electrostatic actuators 50d and the 50e, the film body unit 3 can be separated from the electrode unit 2 even in the state in which the signal voltage of 4 V (volts) is applied. However, increasing the rigidities of the urging units causes the pull-in voltage to increase.

Conversely, according to the electrostatic actuator 1 of this embodiment, the pull-in voltage can be reduced and the pull-out voltage can be increased. Therefore, the operations of the electrostatic actuator 1 can be stabilized drastically. Also, the power consumption can be reduced and the electrostatic actuator 1 can be downsized because the size of the electrode unit can be reduced.

Electrostatic actuators according to other embodiments will now be illustrated.

Figure 7A:
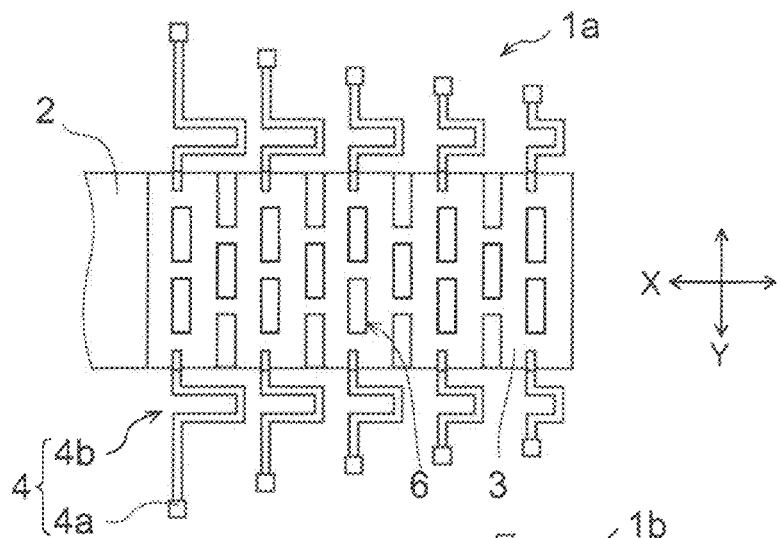
FIGS. 7A to 7C are schematic views illustrating electrostatic actuators according to the other embodiments.
Figure 7B:
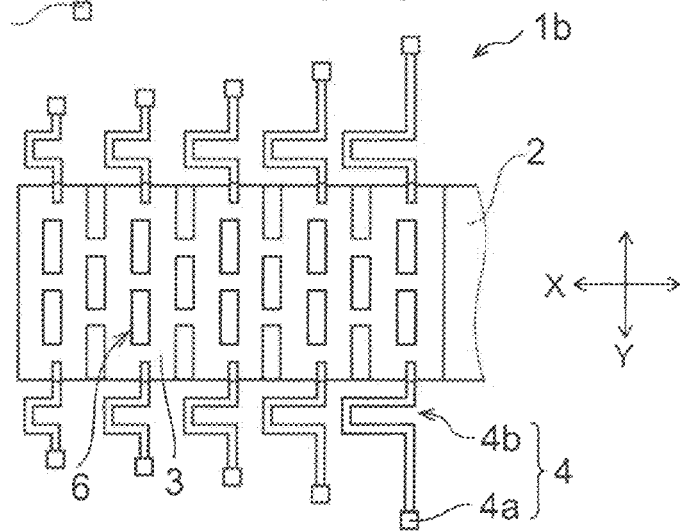
Figure 7C:
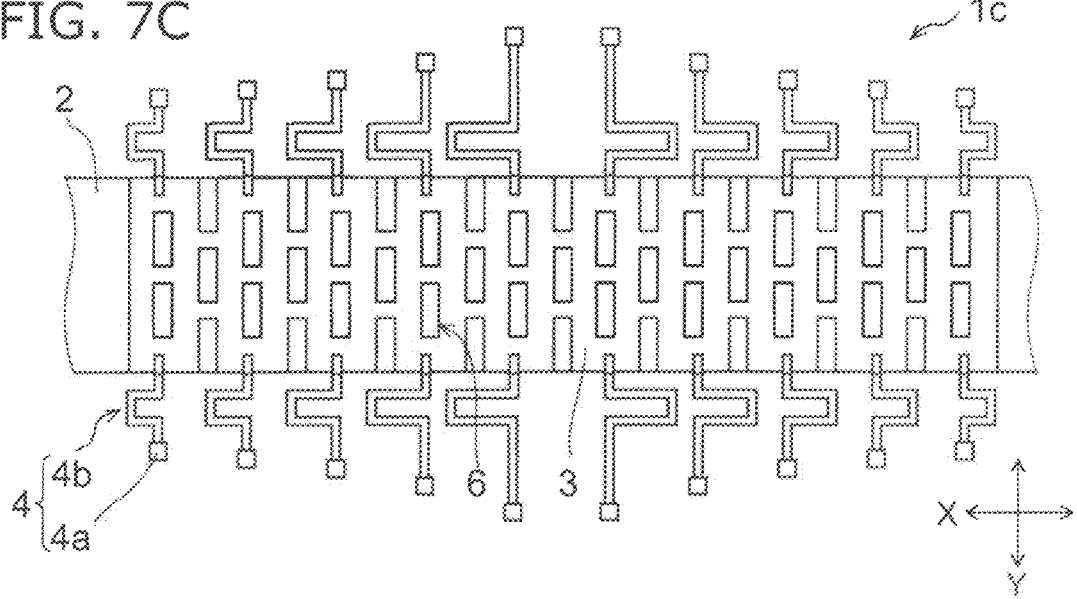

FIGS. 7A to 7C are schematic views illustrating the electrostatic actuators according to the other embodiments.

As in the electrostatic actuators 1*a* and 1*b* illustrated in FIG. 7A and FIG. 7B, the rigidities of the urging units 4 can be changed in stages or gradually from one end portion toward the other end portion of the film body unit 3.

As in the electrostatic actuator 1*c* illustrated in FIG. 7C, the rigidities of the urging units 4 provided at the central portion of the film body unit 3 can be the lowest and the rigidities of the urging units 4 can be increased in stages or gradually toward the end portions of the film body unit 3.

In the case of the electrostatic actuators 1*a* to 1*c* illustrated in FIGS. 7A to 7C as well, the pull-in voltage can be reduced and the pull-out voltage can be increased. Therefore, the operations of the electrostatic actuators 1*a* to 1*c* can be stabilized drastically. Also, the power consumption can be reduced and the electrostatic actuators 1*a* to 1*c* can be downsized because the size of the electrode unit can be reduced.

Knowledge obtained by the inventors regarding the electrostatic actuators illustrated in FIGS. 1A and 1B and FIGS. 7A to 7C will now be illustrated further.

Figure 8:
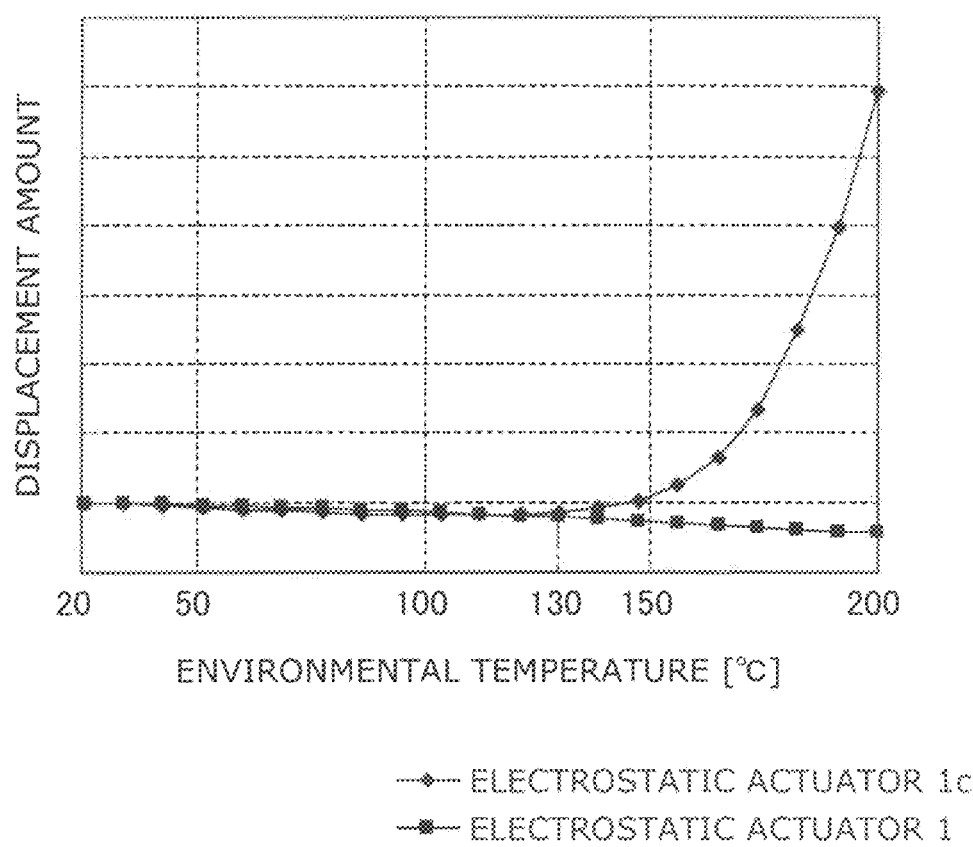
FIG. 8 is a schematic graph illustrating the stability with respect to changes of the environmental temperature.

FIG. 8 is a schematic graph illustrating the stability with respect to changes of the environmental temperature.

FIG. 8 is the result of a FEM (Finite Element Method) simulation of the Z-direction displacement amount of the film body unit center with respect to changes of the environmental temperature. The vertical axis corresponds to the Z-direction displacement amount of the film body unit center; and the horizontal axis corresponds to the environmental temperature. The initial temperature was 20° C. and the environmental temperature was increased to 200° C.

Figure 9A:
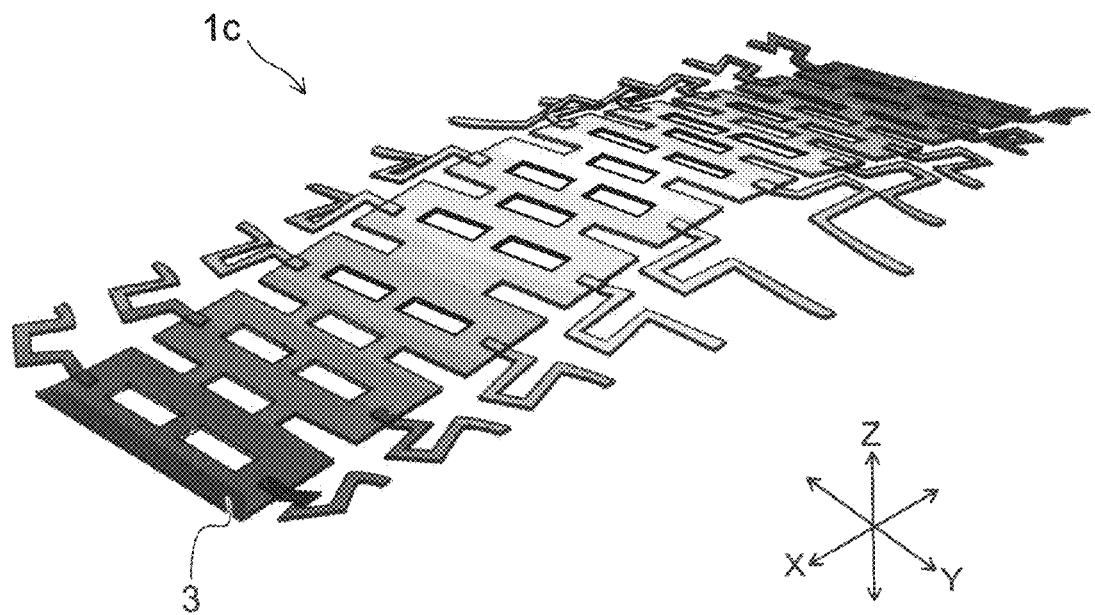
FIGS. 9A and 9B are schematic views illustrating the appearance when the environmental temperature is 200° C.
Figure 9B:
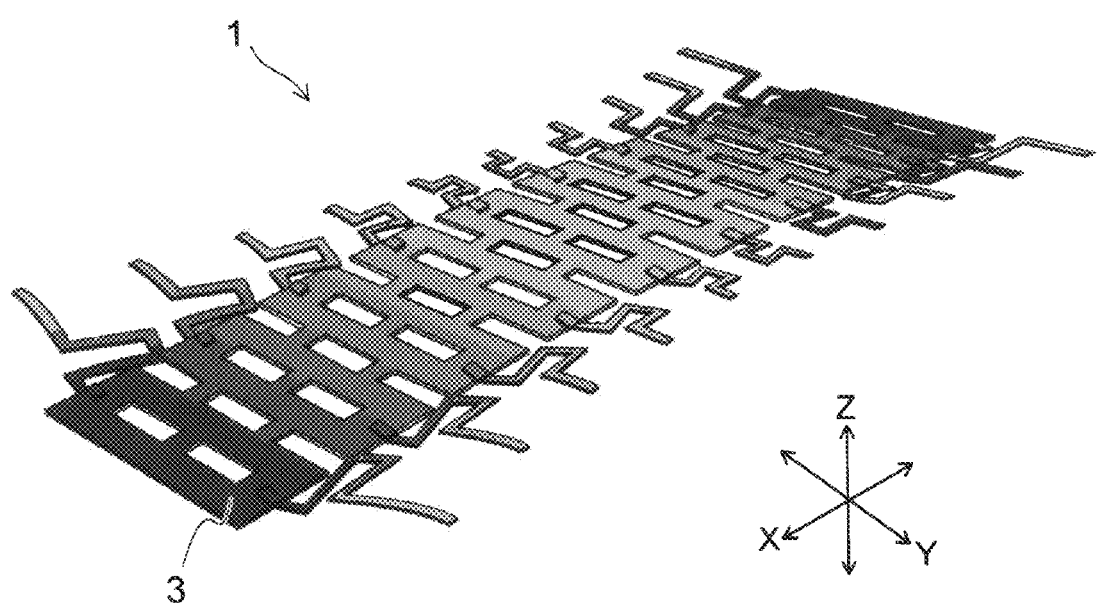

FIGS. 9A and 9B are schematic views illustrating the appearance when the environmental temperature is 200° C.

The Z-direction displacement amount is illustrated by monotone shading in which larger Z-direction displacement amounts are lighter and smaller Z-direction displacement amounts are darker.

FIG. 8 and FIGS. 9A and 9B show that in the case of the electrostatic actuator 1*c* illustrated in FIG. 7C, the displacement amount of the film body unit 3 increases when the environmental temperature exceeds 130° C. Conversely, in the case of the electrostatic actuator 1 illustrated in FIGS. 1A and 1B, the displacement amount of the film body unit 3 does not increase even when the environmental temperature is 200° C.

As the environmental temperature increases, the film body unit 3 expands in the X direction and the Y direction due to thermal expansion. In such a case, because the dimension of the film body unit 3 in the Y direction is short, the expansion in the Y direction can be absorbed by the buffer unit 4*b* even in the case where the film body unit 3 expands in the Y direction.

On the other hand, because the dimension of the film body unit 3 in the X direction is long, the expansion amount due to the thermal expansion is large.

In such a case, in the electrostatic actuator 1*c*, the urging units 4 having high rigidities are provided proximally to the two end portions of the film body unit 3. Therefore, the thermal expansion of the film body unit 3 is impeded and the film body unit 3 deforms easily in the Z direction.

Conversely, in the electrostatic actuator 1, the urging units 4 having high rigidities are provided proximally to the central portion of the film body unit 3. Therefore, the thermal expansion of the film body unit 3 is not impeded much and the film body unit 3 deforms easily in the Z direction.

As a result, as illustrated in FIG. 8 and FIGS. 9A and 9B, the electrostatic actuator 1 is not easily affected by temperature changes.

The environmental temperature may increase to a high temperature not only due to the environment in which the electrostatic actuator is used but also in the manufacturing processes of the electrostatic actuator. For example, in the case where the electrostatic actuator is manufactured using semiconductor processes (the manufacturing technology of semiconductor devices), there are cases where heat treatment at a high temperature is necessary after the film formation.

Therefore, considering the stability with respect to changes of the environmental temperature, it is favorable for the urging units 4 to be disposed as in the electrostatic actuator 1 illustrated in FIGS. 1A and 1B. In other words, it is favorable for the rigidities of the urging units 4 provided proximally to the central portion of the film body unit 3 to be the highest and for the rigidities of the urging units 4 to decrease in stages or gradually toward the end portions of the film body unit 3.

Figure 10A:
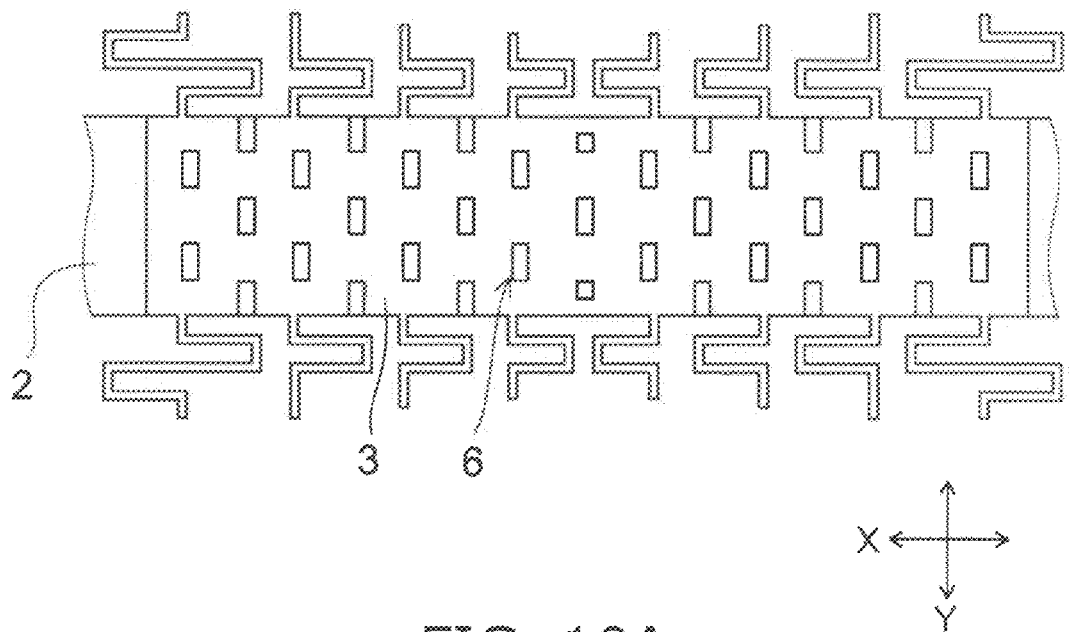
FIGS. 10A and 10B are schematic views illustrating the material configurations of the urging units.
Figure 10B:
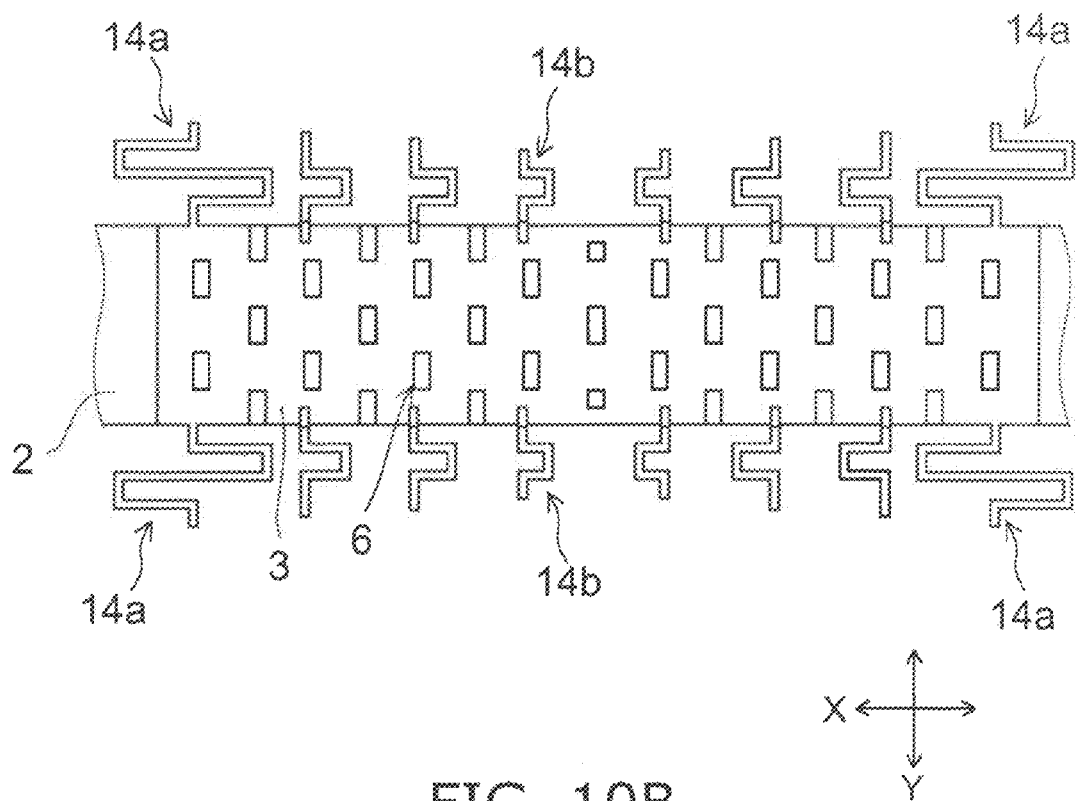

FIGS. 10A and 10B are schematic views illustrating the material configurations of the urging units.

In the case of the electrostatic actuator 1 illustrated in FIGS. 1A and 1B, the urging units 4 and the film body unit 3 can be formed of different materials. For example, the urging units 4 may be formed of a material having a resistance to creep deformation higher than that of aluminum (Al) (e.g., silicon nitride (SiN), silicon oxide (SiO, $SiO_2$, etc.), and titanium aluminide (TiAl, $Ti_3Al$, $Al_3Ti$, etc.) and the like). The film body unit 3 may be formed of a conductive material such as a metal (e.g., aluminum (Al), gold (Au), silver (Ag), copper (Cu), platinum (Pt), or alloys including the same, etc.).

Conversely, FIG. 10A illustrates the case where the urging units and the film body unit are formed of the same material. For example, the case may be illustrated where the urging units and the film body unit are formed of aluminum (Al). Thus, the number of processes of the manufacturing processes can be reduced because the urging units and the film body unit can be formed integrally. Also, in the case where the urging units are formed of a conductive material, the urging units can be used as the grounding portion for applying the ground potential to the film body unit. Therefore, the occupied surface area can be reduced because it is unnecessary to separately provide the not-illustrated grounding portion.

FIG. 10B illustrates the case where urging units 14*a*, which are provided proximally to the two X-direction end portions, are formed of the same material as the film body unit 3; and the other urging units 14*b* are formed of a material having a resistance to creep deformation higher than that of aluminum (Al).

Here, creep deformation generally occurs easily in the conductive materials such as aluminum (Al) used as the material of the film body unit 3. Therefore, in the case where the urging units are formed of the same material (e.g., aluminum (Al), etc.) as the film body unit 3, there is a risk that the life may be shorter.

Therefore, in the case illustrated in FIG. 10B, the urging units 14*a* having the lowest rigidities are formed of the same material (e.g., aluminum (Al), etc.) as the film body unit 3; and the other urging units 14*b* are formed of a material having a resistance to creep deformation higher than that of aluminum (Al).

Because creep deformation does not occur easily when the rigidities of the urging units are low, the shortening of the life can be suppressed even in the case where the urging units 14a are formed of the same material (e.g., aluminum (Al), etc.) as the film body unit 3. Further, because the urging units 14a can be used as the grounding portion, it is unnecessary to separately provide the not-illustrated grounding portion. Therefore, the occupied surface area can be reduced.

Although the same urging unit disposition as that of the electrostatic actuator 1 illustrated in FIGS. 1A and 1B is illustrated in FIGS. 10A and 10B, this is not limited thereto.

For example, application is possible also in the cases of the electrostatic actuators 1a, 1b, and 1c illustrated in FIGS. 7A to 7C. In other words, the urging units and the film body unit may be formed of the same material in the cases of the electrostatic actuators 1a, 1b, and 1c as well. In the cases of the electrostatic actuators 1a, 1b, and is as well, the urging units having the lowest rigidities may be formed of the same material (e.g., aluminum (Al), etc.) as the film body unit 3; and the other urging units may be formed of a material having a resistance to creep deformation higher than that of aluminum (Al).

A method for manufacturing the electrostatic actuator according to this embodiment will now be illustrated.

Figure 11:
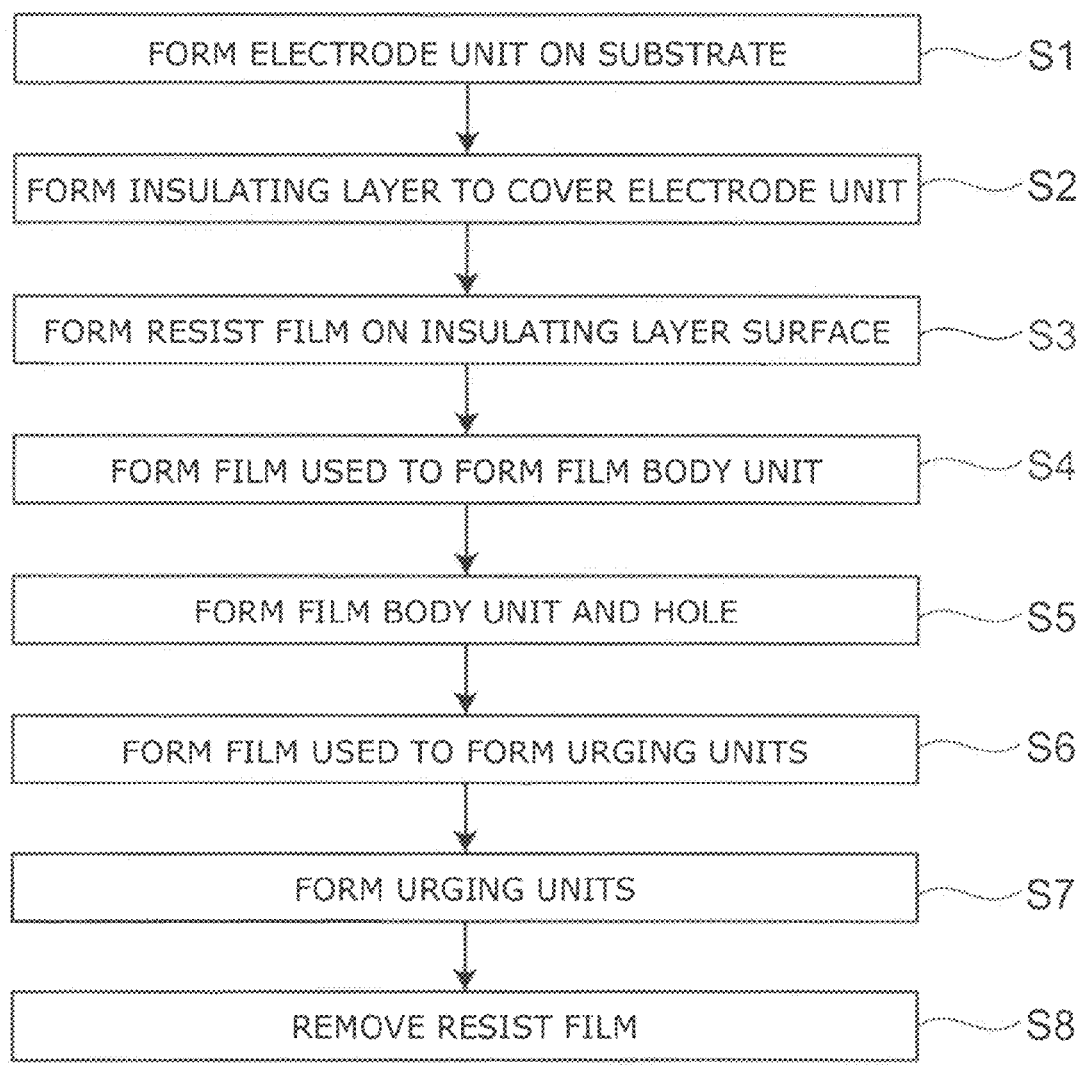
FIG. 11 is a flowchart illustrating a method for manufacturing the electrostatic actuator according to the embodiment.

FIG. 11 is a flowchart illustrating the method for manufacturing the electrostatic actuator according to this embodiment.

The electrostatic actuator according to this embodiment can be manufactured using, for example, so-called semiconductor processes (the manufacturing technology of semiconductor devices).

Namely, first, PVD (Physical Vapor Deposition), CVD (Chemical Vapor Deposition), and the like are used to form a film of a conductive material such as a metal on the substrate 100 which is formed of an insulating material. Then, this film is patterned into the desired configuration using lithography to form the electrode unit 2 (step S1).

Then, PVD (Physical Vapor Deposition), CVD (Chemical Vapor Deposition), and the like are used to form a not-illustrated insulating layer to cover the electrode unit 2 (step S2). Then, a resist film having the desired configuration is formed on the surface of the not-illustrated insulating layer (step S3). As described below, the resist film is used as a sacrificial layer (a layer which is ultimately removed).

Continuing, PVD (Physical Vapor Deposition), CVD (Chemical Vapor Deposition), and the like are used to cover the resist film by forming a film used to form the film body unit 3 (step S4). The portion used to form the urging units also is formed as a film in the case where the urging units and the film body unit are to be formed of the same material as in the electrostatic actuators illustrated in FIG. 10A and the like.

Then, lithography is used to form the film body unit 3 and the holes 6 (step S5).

The urging units also are formed in the case where the urging units 4 and the film body unit 3 are to be formed of the same material.

Then, PVD (Physical Vapor Deposition), CVD (Chemical Vapor Deposition), and the like are used to form a film used to form the urging units 4 (step S6).

Continuing, lithography is used to form the urging units 4 (step S7).

If necessary, the not-illustrated grounding portion also may be formed such that the film body unit 3 has the ground potential.

Then, the resist film is removed by ashing (step S8).

After removing the resist film, the gap 5 of the prescribed dimension forms between the major surface of the film body unit 3 and the major surface of the electrode unit 2. Because the holes 6 are made in the film body unit 3, the resist film can be removed easily via the holes 6.

According to the embodiments described above, a more reliable electrostatic actuator having a lower pull-in voltage, a higher pull-out voltage, and more stable operations compared to those of conventional art can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Moreover, above-mentioned embodiments can be combined mutually and can be carried out.

For example, the configurations, dimensions, materials, dispositions, numbers, etc., of the components included in the electrostatic actuators 1, 1a to 1e, and the like are not limited to those illustrated and may be modified appropriately.

Although the change of the electrical capacitance between the film body unit 3 and the electrode unit 2 is utilized in switching, etc., in the electrostatic actuators illustrated in FIGS. 1A and 1B and the like, this is not limited thereto. For example, multiple separated signal electrode portions may be provided; and switching and the like may be performed by the contact and separation of the film body unit 3.

Also, the operation of the film body unit 3 may be utilized without providing the signal electrode portions. For example, utilization is possible in the switching operation of a micro optical switch, the liquid droplet dispensing operation of a liquid droplet dispensing head such as an inkjet head, the operation of a probe of a scanning probe microscope, the operations of other various micromachines, etc.

The invention claimed is:

1. An electrostatic actuator, comprising:
an electrode unit provided on a substrate;
a conductive film body unit provided opposing the electrode unit, the conductive film body unit having a rectangular shape, the conductive film body unit having a plurality of rectangular holes, and a long-axis direction of the holes being substantially orthogonal to a long-axis direction of the conductive film body unit;
a plurality of first urging units provided at a first circumferential edge portion of the conductive film body unit to support the film body unit, the plurality of first urging units provided in the long-axis direction of the conductive film body unit, the plurality of first urging units extending substantially orthogonal to the long-axis direction of the conductive film body unit; and
a plurality of second urging units provided at a second circumferential edge portion opposing the first circumferential edge portion to support the film body unit, the plurality of second urging units provided in the long-axis direction of the conductive film body unit, the plurality of second urging units extending substantially orthogonal to the long-axis direction of the conductive film body unit,
the electrode unit and the conductive film body unit contacting or separated from each other, the electrode unit being set to a voltage having a prescribed value,
the plurality of first urging units having mutually different rigidities, and the plurality of second urging units having mutually different rigidities.

2. The electrostatic actuator according to claim 1, wherein the rigidities of the plurality of first urging units change in stages or gradually between the plurality of first urging units.

3. The electrostatic actuator according to claim 1, wherein the rigidities of the plurality of second urging units change in stages or gradually between the plurality of second urging units.

4. The electrostatic actuator according to claim 1, wherein the rigidities of the plurality of first urging units are higher at a central portion side of the first circumferential edge portion than at an end portion side of the first circumferential edge portion.

5. The electrostatic actuator according to claim 1, wherein the rigidities of the plurality of second urging units are higher at a central portion side of the second circumferential edge portion than at an end portion side of the second circumferential edge portion.

6. The electrostatic actuator according to claim 1, wherein the rigidities of the plurality of first urging units change in stages or gradually from one end portion toward one other end portion of the first circumferential edge portion.

7. The electrostatic actuator according to claim 1, wherein the rigidities of the plurality of second urging units change in stages or gradually from one end portion toward one other end portion of the second circumferential edge portion.

8. The electrostatic actuator according to claim 1, wherein the rigidities of the plurality of first urging units are lower at a central portion side of the first circumferential edge portion than at an end portion side of the first circumferential edge portion.

9. The electrostatic actuator according to claim 1, wherein the rigidities of the plurality of second urging units are lower at a central portion side of the second circumferential edge portion than at an end portion side of the second circumferential edge portion.

10. The electrostatic actuator according to claim 1, wherein the plurality of first urging units and the plurality of second urging units are provided at mutually opposing positions respectively.

11. The electrostatic actuator according to claim 1, wherein the rigidity of the first urging unit and the rigidity of the second urging unit at mutually opposing positions are substantially the same.

12. The electrostatic actuator according to claim 1, wherein one end of the hole provided proximally to the first circumferential edge portion is open at the first circumferential edge portion.

13. The electrostatic actuator according to claim 1, wherein one end of the hole provided proximally to the second circumferential edge portion is open at the second circumferential edge portion.

14. The electrostatic actuator according to claim 1, wherein the plurality of first urging units and the plurality of second urging units are formed of the same material as the conductive film body unit.

15. The electrostatic actuator according to claim 1, wherein the first urging unit having the lowest rigidity of the plurality of first urging units and the second urging unit having the lowest rigidity of the plurality of second urging units are formed of the same material as the conductive film body unit.

16. The electrostatic actuator according to claim 1, wherein the plurality of first urging units and the plurality of second urging units are formed of a material having a resistance to creep deformation higher than a resistance to creep deformation of aluminum.

17. The electrostatic actuator according to claim 1, comprising:
    a first buffer unit formed to protrude in a direction orthogonal to a long-axis direction of the first urging unit; and
    a second buffer unit formed to protrude in a direction orthogonal to a long-axis direction of the second urging unit.

18. The electrostatic actuator according to claim 1, comprising:
    a power source connected to the electrode unit; and
    a signal generation unit connected to the electrode unit.

19. The electrostatic actuator according to claim 1, wherein the conductive film body unit has a ground potential.

20. The electrostatic actuator according to claim 1, wherein a long-axis direction of the first urging unit is substantially orthogonal to the long-axis direction of the conductive film body unit.

21. The electrostatic actuator according to claim 20, further comprising:
    a first buffer unit formed to protrude in a direction orthogonal to the long-axis direction of the first urging unit; and
    a second buffer unit formed to protrude in a direction orthogonal to a long-axis direction of the second urging unit.

22. The electrostatic actuator according to claim 1, wherein a long-axis direction of the second urging unit is substantially orthogonal to the long-axis direction of the conductive film body unit.

23. The electrostatic actuator according to claim 22, further comprising:
    a first buffer unit formed to protrude in a direction orthogonal to a long-axis direction of the first urging unit; and
    a second buffer unit formed to protrude in a direction orthogonal to the long-axis direction of the second urging unit.

* * * * *